United States Patent [19]

Kinoshita

[11] Patent Number: 5,759,883
[45] Date of Patent: Jun. 2, 1998

[54] METHOD FOR MAKING SEMICONDUCTOR DEVICE CAPABLE OF INDEPENDENTLY FORMING MOS TRANSISTORS AND BIPOLAR TRANSISTOR

[75] Inventor: Yasushi Kinoshita, Tokyo, Japan

[73] Assignee: NEC Corporation, Tokyo, Japan

[21] Appl. No.: 752,931

[22] Filed: Nov. 20, 1996

[30] Foreign Application Priority Data

Dec. 18, 1995 [JP] Japan ................... 7-328643

[51] Int. Cl.⁶ ............................................ H01L 21/8238
[52] U.S. Cl. .................... 438/202; 438/232; 438/233; 257/370; 257/378
[58] Field of Search ...................... 438/202, 232, 438/233, 165, 219; 257/370, 378

[56] References Cited

U.S. PATENT DOCUMENTS

| | | | |
|---|---|---|---|
| 4,475,279 | 10/1984 | Gahle | 437/59 |
| 4,536,945 | 8/1985 | Gray et al. | 437/59 |
| 4,960,726 | 10/1990 | Lechaton et al. | 437/59 |
| 4,965,220 | 10/1990 | Iwasaki | 437/59 |
| 4,987,089 | 1/1991 | Roberts | 437/59 |
| 5,045,493 | 9/1991 | Kameyama et al. | 437/59 |
| 5,059,549 | 10/1991 | Furuhata | 437/59 |
| 5,132,234 | 7/1992 | Kim et al. | 437/59 |
| 5,196,356 | 3/1993 | Won et al. | 437/59 |
| 5,340,762 | 8/1994 | Vora | 437/52 |
| 5,348,896 | 9/1994 | Jang et al. | 437/59 |
| 5,439,833 | 8/1995 | Hebert et al. | 437/59 |
| 5,512,497 | 4/1996 | Ikeda et al. | 437/59 |
| 5,525,530 | 6/1996 | Watabe | 437/59 |
| 5,597,757 | 1/1997 | Maeda et al. | 437/59 |
| 5,607,866 | 3/1997 | Sato et al. | 437/59 |

FOREIGN PATENT DOCUMENTS

6-71066  9/1994  Japan .

*Primary Examiner*—John Niebling
*Assistant Examiner*—Long Pham
*Attorney, Agent, or Firm*—Foley & Lardner

[57] ABSTRACT

In a method of manufacturing a semiconductor integrated circuit device composed of a bipolar transistor and metal-oxide-semiconductor (MOS) transistors, first and second gate electrode structures are formed to have polysilicon layers having no impurity implanted and to be provided on a gate oxide film. First impurity ions are implanted in self-alignment with said first gate electrode structure to form an N-channel MOS transistor. Second impurity ions are implanted in self-alignment with said second gate electrode structure to form a P-channel MOS transistor after a bipolar transistor is formed.

39 Claims, 9 Drawing Sheets

METHOD FOR MAKING SEMICONDUCTOR DEVICE CAPABLE OF INDEPENDENTLY FORMING MOS TRANSISTORS AND BIPOLAR TRANSISTOR

BACKGROUND OF THE INVENTION

1. Field of the Invention

The present invention generally relates to a method for manufacturing a semiconductor integrated circuit device. More specifically, the present invention is directed to a method for manufacturing a BiCMOS device in which CMOS transistors and a bipolar transistor are manufactured on the same substrate.

2. Description of the Related Art

With the great progress in techniques of manufacturing semiconductor integrated circuits, a strong demand has risen to form digital circuits and analog circuits on a same chips. As an integrated circuit capable of satisfying this demand, there is a BiCMOS device which contains CMOS transistors, by use of which a logic circuit can be formed in high density, and a bipolar transistor capable of processing a very small analog signal at high speed and in a linear manner.

However, the manufacturing process of the BiCMOS device is extremely complex, because the structure of the CMOS transistor is different from that of the bipolar transistor. Also, the BiCMOS device has a problem that the performance of the bipolar transistor cannot be sufficiently achieved due to constraints on the manufacturing process. To solve this problem, it is important to shallowly form a base region and emitter region of a bipolar transistor portion without producing adverse influences on a CMOS circuit portion.

Japanese Laid-open Patent Application (JP-A-showa 61-230354) (Japanese Examined Patent Disclosure (JP-B-Heisei 6-71066)) discloses the method for manufacturing the semiconductor integrated circuit device operable at high speeds and under low power consumption in view of this shallow region forming. The disclosed manufacturing method is composed of the below-mentioned steps. First, after a drain region, source region, and gate electrode of a CMOS circuit portion have been formed, an interlayer insulating film is deposited on the entire surface. Thereafter, the interlayer insulating film of the bipolar transistor portion is removed. Next, a base region and collector region are formed in the bipolar transistor portion, and subsequently, the electrode window is formed in the surface insulating film. After the polysilicon layer has been deposited on the overall surface, the emitter region is formed by way of either an ion implantation method or a solid phase diffusing method from a PSG film. Then, the polysilicon film of the CMOS transistor portion is removed, and the electrode window of the CMOS transistor portion is formed in the interlayer insulating film by a taper etching method.

Referring now to FIGS. 1A to 1G, the above-described method for manufacturing the semiconductor integrated circuit device will be described more in detail.

Figure 1A:
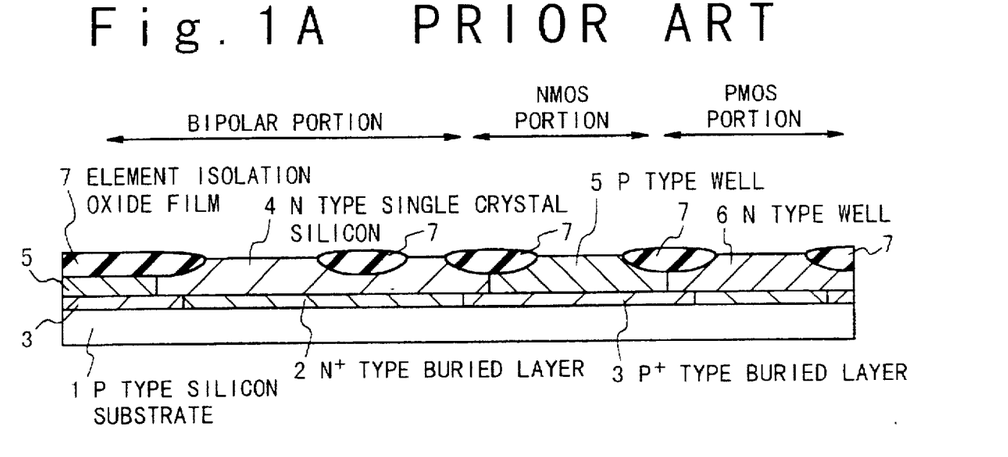
FIGS. 1A through 1G are cross sectional views for illustrating the manufacturing method of a conventional semiconductor integrated circuit.

As represented in FIG. 1A, using a resist pattern as a mask, the $N^+$ type buried films 2 are selectively formed in a P-channel type MOS transistor portion and the bipolar transistor portion of a P type silicon substrate 1. Similarly, the $P^+$ type buried films 3 are formed in an N-channel MOS transistor portion and the peripheral portion of the bipolar transistor portion. The $P^+$ type buried film 3 may have a function to separate a bipolar transistor element from other elements in an insulating manner.

2

Next, the N type single crystal silicon film 4 is grown on the P type silicon substrate 1 in which the $N^+$ type buried layers 2 and the $P^+$ type buried layers 3 have been formed. Since growing of the N type single crystal silicon film 4 is carried out in the atmosphere at a temperature higher than 1,000° C., both the $N^+$ type buried layer 2 and the $P^+$ type buried film 3 are expanded into the N type single crystal silicon film 4.

Then, the N type single crystal silicon 4 is subjected to ion implantation, so that P type wells 5 are formed in the NMOS transistor portion and the peripheral portion of the bipolar transistor portion, and the N type well 6 is formed in the PMOS transistor portion. Then, element isolation oxide films 7 having a thickness of 300 nm to 400 nm are formed by employing the LOCOS method using selective oxidation.

Figure 1B:
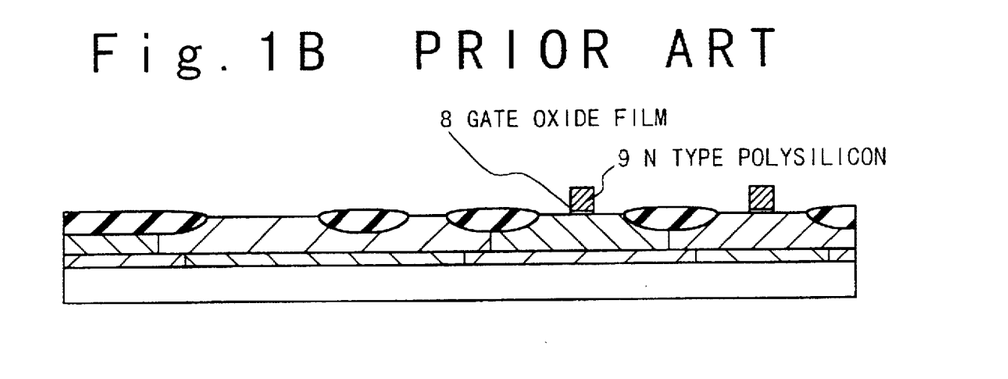

Thereafter, as shown in FIG. 1B, the gate oxide film 8 is formed on the entire surface. Furthermore, after the N type polysilicon 9 has been deposited, the gate oxide film 8 and the N type polysilicon 9 in the regions other than such regions which will become the gate electrode of the NMOS transistor portion and the gate electrode of the PMOS transistor portion are etched back by employing a dry etching process.

Figure 1C:
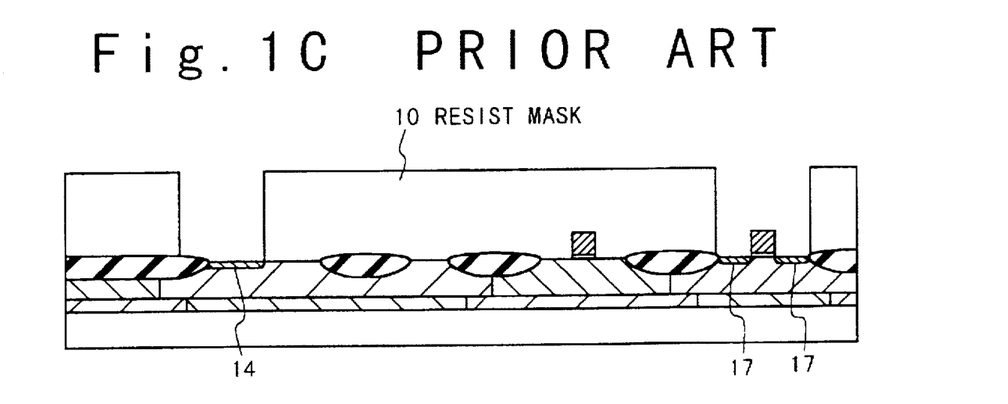

Next, as shown in FIG. 1C, boron ions are implanted using a resist pattern 10 as a mask, in which the source region and drain region of the PMOS transistor portion and the external base region of the bipolar transistor portion are opened.

Figure 1D:
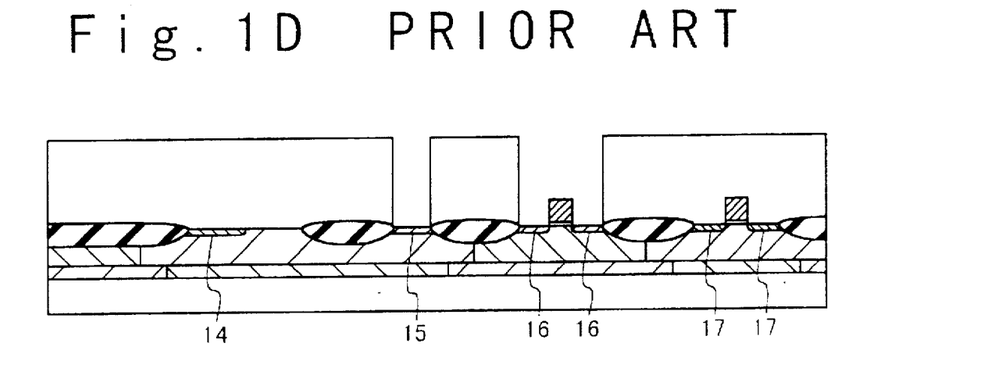

Next, as shown in FIG. 1D, arsenic ions are implanted using a resist pattern 11 as a mask, in which the source region and drain region of the NMOS transistor portion and the collector region of the bipolar transistor portion are opened.

Figure 1E:
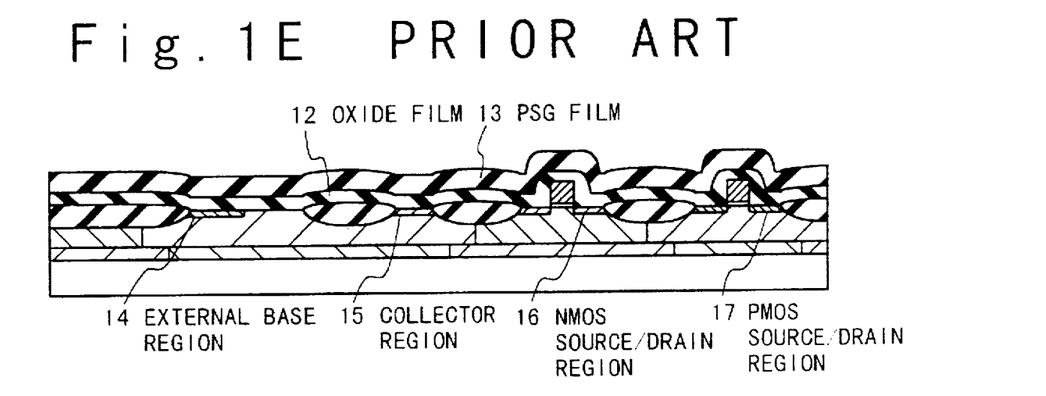

Thereafter, as illustrated in FIG. 1E, an oxide film 12 is formed above the respective gate electrodes, source regions, and drain regions of the NMOS transistor portion and PMOS transistor portion, and also the region of the bipolar transistor. A PSG film 13 is deposited on the oxide film 12. Next, the PSG film corresponding to the region of the bipolar transistor is selectively removed. Next, the PSG film is heated and melted in an oxygen gas ambient equal to or lower than 950° C. As a result, an external base region 14 and collector region 15 of the bipolar transistor portion, the source/drain region 16 of the NMOS transistor portion, and the source/drain region 17 of the PMOS transistor portion are activated.

Figure 1F:
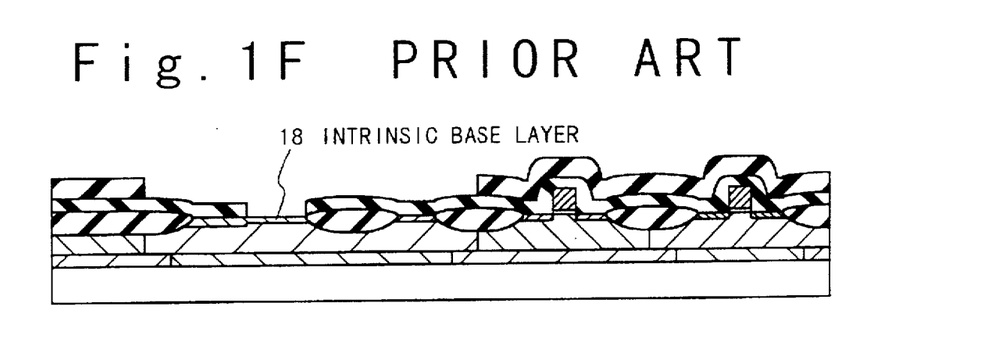

Next, as shown in FIG. 1F, using a resist pattern as the mask where only the base region is opened, boron ions are implanted to thereby form an intrinsic base layer 18. Subsequently, an emitter contact hole 19 is formed in the bipolar transistor portion.

Figure 1G:
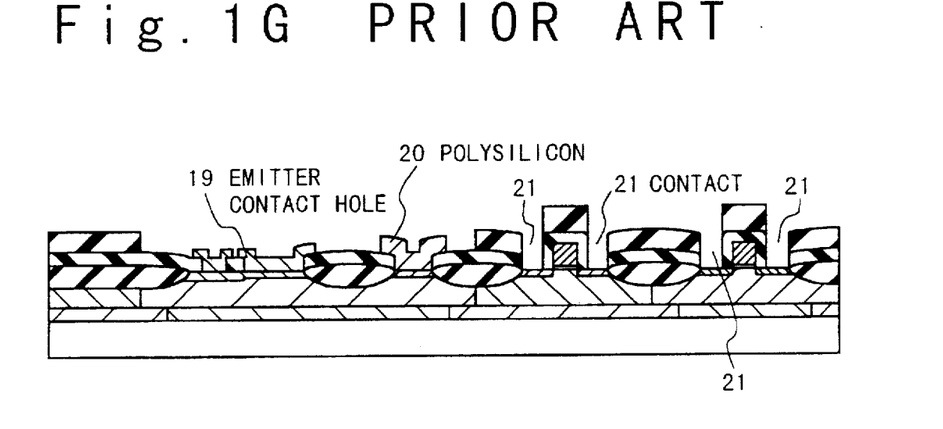

Then, as illustrated in FIG. 1G, polysilicon 20 having a thickness of approximately 50 nm is deposited on the entire surface, and arsenic ion implantation is carried out using as the mask a resist in which only the collector region and the emitter region are opened. After a polysilicon film 20 is deposited, arsenic ions are implanted into the films 20 while the diffusion amount of arsenic ions is precisely controlled. Then, the polysilicon 20 of the bipolar transistor portion is wiring-patterned. Next, the polysilicon films of the NMOS transistor portion and the PMOS transistor portion are removed by employing an etching process, and the contacts 21 of the source region and drain region are opened by etching back the PSG film by way of a taper etching method. The descriptions about the subsequent aluminum wiring steps are omitted.

However, in the above-described conventional method for manufacturing the semiconductor integrated circuit device, both the ion implantation into the respective source and drain regions of the NMOS transistor portion and PMOS transistor portion, and forming of the external base region and collector region of the bipolar transistor portion, are carried out by using the same mask. Therefore, the CMOS transistors cannot be formed completely independent from the bipolar transistor. As a result, it is difficult to maintain the characteristics of the respective elements under optimum conditions.

When thermal treatment is carried out in order to perform the emitter forced diffusion of the bipolar transistor portion, since heat is also transferred to the CMOS transistor portion, the gate length of the CMOS transistor would be shortened, so that a so-called "short channel effect" could easily occur. This problem would become more serious in the case that the CMOS transistors are manufactured with very fine widths, yielding a MOS transistor with a gate electrode having a length of a sub-quarter micron. As a consequence, both the NMOS transistor and the PMOS transistor require the surface channel type transistors.

However, a surface channel type transistor has a problem which cannot be solved by the conventional manufacturing method. That is, when a surface channel type transistor is formed, there is a trade-off relationship between the formation of the source/drain regions having shallow impurity profiles and the prevention of depletion of the gate electrode. The depletion of the gate electrode would particularly become remarkable in a P-channel type MOS transistor in which boron having a large diffusion coefficient is used as an impurity.

To avoid this problem, molecule ions such as $BF_2$ are widely used instead of boron ions. However, in the thermal treatment stage after ion implantation, a boron atom may pass through the gate oxide film and then may be easily diffused into the channel region at an increased speed due to presence of fluorine atom. As a result, the threshold value of the transistor is affected. Accordingly, in the case where a BiCMOS device having the surface channel type CMOS transistors and a bipolar transistor are manufactured, a large amount of heat could not be applied during thermal treatment for manufacturing the P channel type MOS transistor.

SUMMARY OF THE INVENTION

Therefore an object of the present invention is to provide a method for manufacturing a semiconductor integrated circuit device capable of completely, independently manufacturing a MOS transistor and a bipolar transistor.

In order to achieve an aspect of the present invention, a method of manufacturing a semiconductor integrated circuit device composed of a bipolar transistor and metal-oxide-semiconductor (MOS) transistors, includes the steps of:

forming first and second gate electrode structures, having polysilicon layers having no impurity implanted and formed on a gate oxide film;

forming a bipolar transistor such as a two-layer polysilicon self-alignment type bipolar transistor;

implanting first impurity ions in self-alignment with the first gate electrode structure to form an N-channel MOS transistor; and implanting second impurity ions in self-alignment with the second gate electrode structure to form a P-channel MOS transistor after the bipolar transistor is formed.

Side wall insulating films may be further formed on side walls of the first and second gate electrode structures before the N-channel MOS transistor and the P-channel MOS transistor are formed for. Also, silicide films are formed upper portions of the first and second gate electrode structures and diffusion layers of each of the N-channel MOS transistor and the P-channel MOS transistor.

In the step of forming a bipolar transistor, an intrinsic base layer is formed, an emitter contact hole is formed in a portion corresponding to the intrinsic base layer, side wall insulating films are formed on inner walls of the emitter contact hole, and then a polysilicon film is deposited in the emitter contact hole into which the side wall insulating films are formed to form an emitter electrode.

After the first impurity ions are implanted in self-alignment with the first gate electrode structure, it is desirable that the first impurity ions contained in source and drain regions of the N-channel MOS transistor are activated. Also, after the second impurity ions are implanted in self-alignment with the second gate electrode, it is desirable that heat treatment is performed in a nitrogen atmosphere for an emitter forced diffusion. After the step of performing heat treatment, the second impurity ions contained in source and drain regions are activated by lamp annealing.

The bipolar transistor is formed by implanting impurity ions into base and emitter regions of the bipolar transistor after the N-channel MOS transistor is formed, and before the P-channel MOS transistor is formed.

In order to achieve another aspect of the present invention, a method of manufacturing a semiconductor integrated circuit device composed of a bipolar transistor and metal-oxide-semiconductor (MOS) transistors, includes the steps of:

forming first and second gate electrode structures each of which has an N type polysilicon film on a gate oxide film;

implanting first impurity ions in self-alignment with the first gate electrode structure to form an N channel MOS transistor;

implanting second impurity ions in self-alignment with the second gate electrode structure to form a P channel MOS transistor; and forming a bipolar transistor after the step of forming the N channel MOS transistor and the step of forming the P channel MOS transistor.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Referring now to the drawings, a semiconductor integrated circuit of the present invention will be described.

FIRST EMBODIMENT

In accordance with a semiconductor integrated circuit device of a first embodiment of the present invention, since impurity is simultaneously conducted into a source region, drain region, and gate electrode of each of MOS transistors during an ion implantation process, a gate electrode of an N-channel type MOS transistor becomes an N type whereas a gate electrode of a P-channel type MOS transistor becomes a P type. As a result, both the N-channel type MOS transistor and the P-channel type MOS transistor become surface-channel type transistors.

A method for manufacturing a semiconductor integrated circuit device according to the first embodiment will now be explained with reference to the cross sectional views for illustrating manufacturing steps shown in FIG. 2A to 2H.

It should be noted that the respective manufacturing steps for forming $N^+$ type buried layers 2 and $P^+$ type buried layers 3 in the P type silicon substrate 1 and thereafter for forming the element isolation oxide films 7 are the same as those of the conventional semiconductor integrated circuit device manufacturing method, as previously explained with reference to FIG. 1A.

Figure 2A:
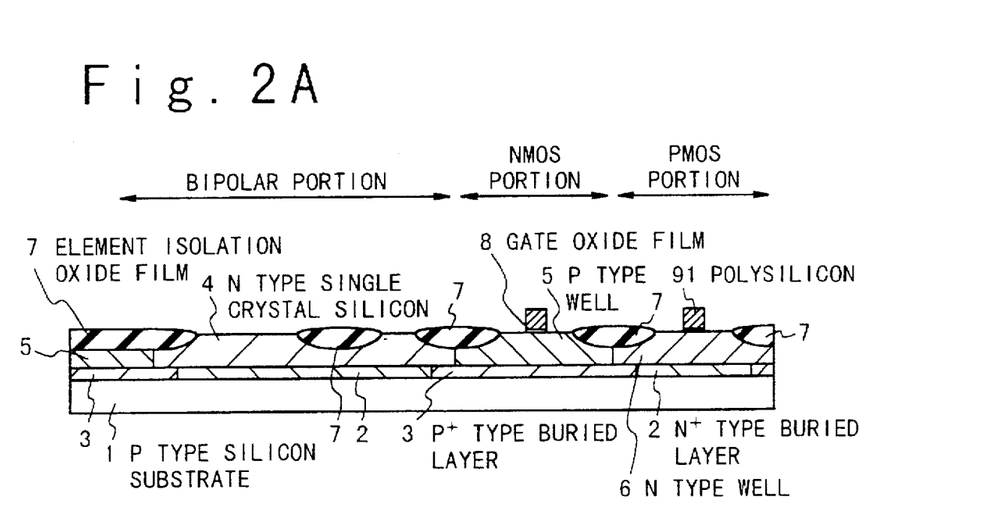
FIGS. 2A through 2H are cross sectional views for illustrating a manufacturing method of a semiconductor integrated circuit device according to a first embodiment of the present invention.

Upon completion of the formation of the element isolation oxide films 7, gate electrodes of the MOS transistors are subsequently formed. That is, as shown in FIG. 2A, a gate oxide film 8 is formed on the entire surface, and a polysilicon film 91 into which no impurity is doped is furthermore deposited on this gate oxide film 8. It is desirable that the thickness of the gate oxide film 8 is selected in a range of 5 nm to 15 nm, and the thickness of the polysilicon film 91 is selected in a range of 150 nm to 200 nm. The polysilicon film 91 deposited at a region other than regions which will constitute the gate electrode of an NMOS transistor portion and the gate electrode of a PMOS transistor portion is etched back by performing a dry etching process so as to pattern the gate electrodes.

Figure 2B:
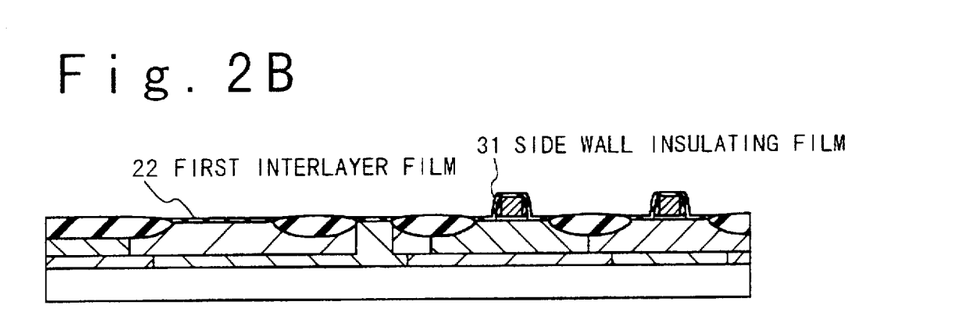

Next, an interlayer insulating film is formed. That is, as illustrated in FIG. 2B, side wall insulating films 31 are first formed in such a manner that the thickness of this insulating film 31 is in a range of 40 nm to 60 nm. Subsequently, a first interlayer film 22 composed of an oxide film is formed as a part of the interlayer insulating film on the entire surface such that the thickness of this first interlayer film 22 is in a range of 10 nm to 30 nm.

Figure 2C:
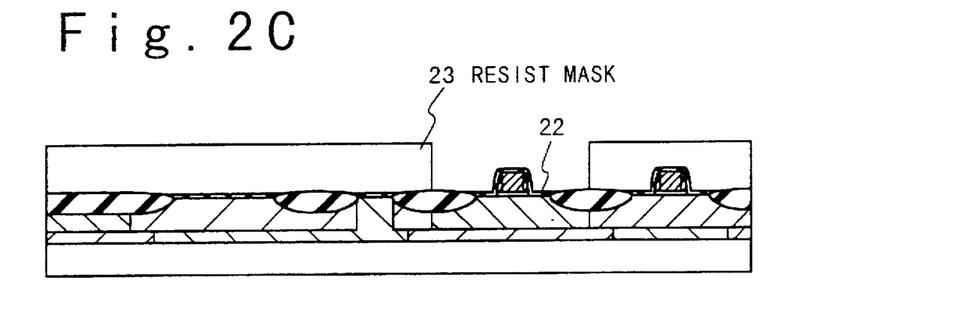

Next, as indicated in FIG. 2C, using as a mask a resist 23 which is opened for an NMOS transistor portion, arsenic ions as impurity ions are implanted through the first interlayer film 22 into a source region, drain region, and gate electrode of the NMOS transistor portion. The energy value of the arsenic ion implantation is set to 30 keV to 80 keV, depending upon the thickness of the first interlayer film 22, in order that arsenic ions may pass through the first interlayer film 22 and may be injected into the silicon substrate to a preselected depth. It should be understood that arsenic ions never penetrate through the polysilicon 91 of the gate electrode at this implantation energy value.

Figure 2D:
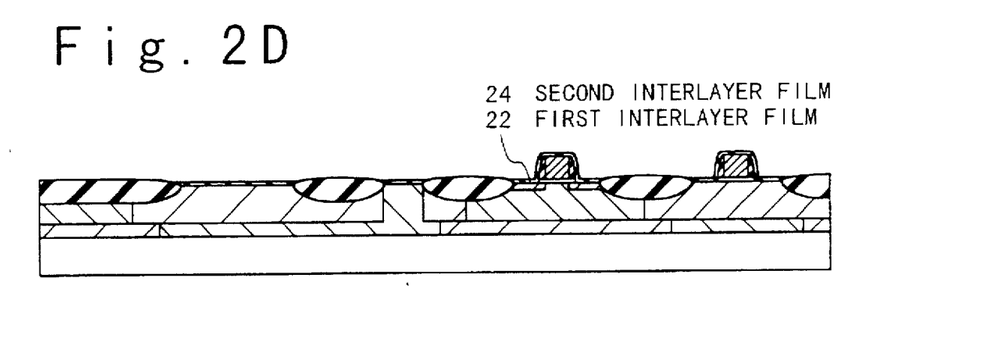

Next, as represented in FIG. 2D, the resultant semiconductor integrated circuit device is subjected to heat treatment in the temperature range from 850° C. to 900° C. for 5 minutes to 15 minutes in a nitrogen atmosphere. As a consequence, the impurities contained in the source region and drain region of the NMOS transistor portion are activated, so that an N-channel type MOS transistor is formed. Subsequently, a second interlayer film 24 is formed as a part of the interlayer insulating film, the thickness of which is selected in a range of 10 nm to 30 nm.

Figure 2E:
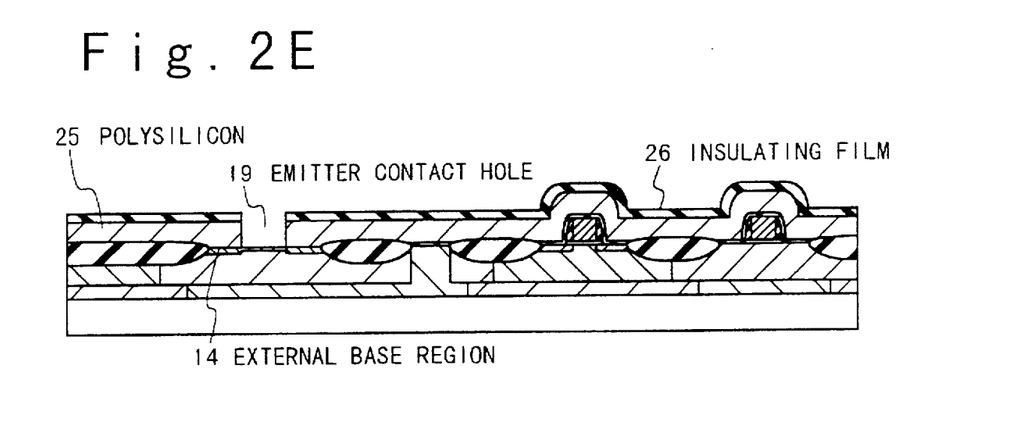

Thereafter, as shown in FIG. 2E, after the interlayer insulating film composed of the first interlayer film 22 and the second interlayer film 24 in the bipolar transistor portion has been removed, a polysilicon film 25 which will constitute a base electrode of a bipolar transistor is deposited on the entire surface, and an insulating film 26 such as a nitride film is deposited on the polysilicon film 25. Boron ions are previously implanted into the polysilicon film 25. Then, an emitter contact hole 19 is formed in a contact region of the polysilicon film 25 and insulating film 26. Next, boron is conducted into a base region of the bipolar transistor portion as an impurity in order to form an intrinsic base layer by way of, for instance, ion implantation. It should be noted that the bipolar transistor according to the first embodiment corresponds to a two-layer polysilicon self-alignment type bipolar transistor. Since this type of bipolar transistor has a low stray resistance as well as a low stray capacitance, this polysilicon self-alignment type bipolar transistor is suitable for a high-speed bipolar transistor.

Figure 2F:
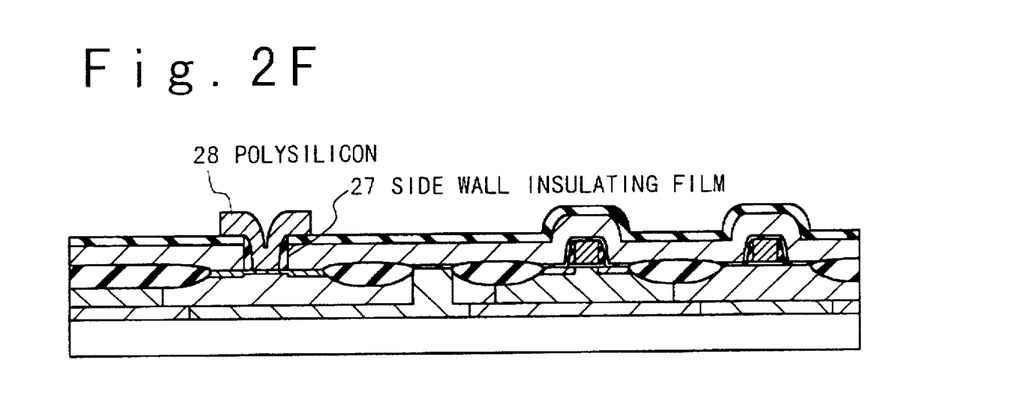

Then, as shown in FIG. 2F, side wall insulating films 27 are formed within the emitter contact hole 19, and thereafter, polysilicon 28 which will constitute an emitter electrode is deposited on the entire surface. Either arsenic or phosphorus is added as an impurity into this polysilicon 28. Subsequently, the polysilicon 28 is etched back by way of a dry etching process to thereby pattern the emitter electrode. Thereafter, the insulating film 26 and the polysilicon film 25 are similarly removed by a dry etching process. As a result, the insulating film 26 and the polysilicon film 25 of the NMOS transistor portion and the PMOS transistor portion are removed.

Figure 2G:
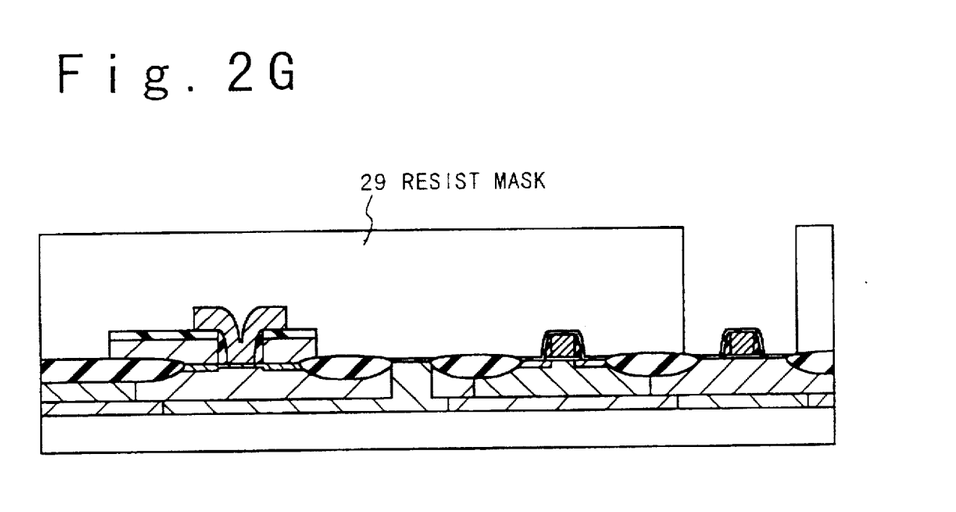

Next, as illustrated in FIG. 2G, employing a resist pattern 29 which is opened for a PMOS transistor portion as a mask, $BF_2$ ions are implanted into a source region, drain region, and gate electrode of the PMOS transistor portion. The energy value of this ion implantation is set to 40 keV to 90 keV, depending upon the thicknesses of the first and second interlayer films, such that boron may pass through the first and second interlayer films and may be injected into the silicon substrate into a preselected depth.

It should also be noted that the second interlayer film 24 as the oxide film having thickness of 10 to 20 nm shown in FIG. 2D may be formed immediately before the $BF_2$ ions are injected.

Then, the resultant semiconductor integrated circuit device is thermally processed in the temperature range from 800° C. to 850° C. for 10 minutes to 20 minutes in a nitrogen atmosphere. As a result, the emitter forced diffusion of the bipolar transistor is carried out.

Figure 2H:
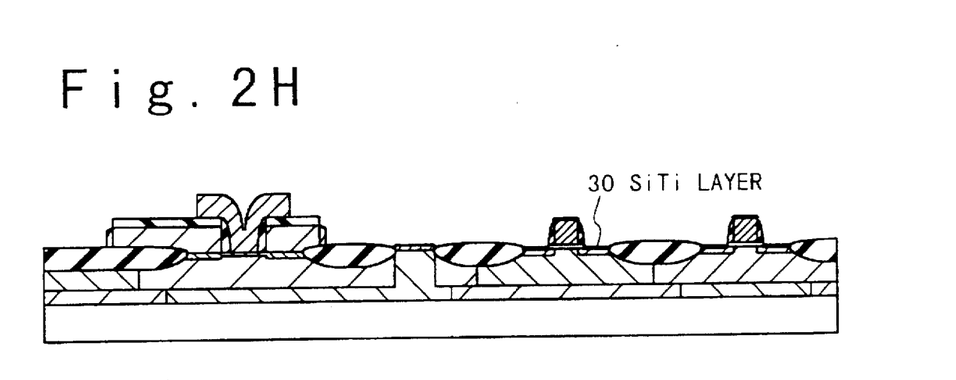

Next, as represented in FIG. 2H, a rapid heating process is performed by way of a lamp anneal in order to activate the impurity ions contained in the source region and the drain region of the PMOS transistor portion. Then, both the first interlayer film 22 and the second interlayer film 24 are etched backed so as to expose the diffusion regions and the upper portion of the gate electrode, which will be thereafter processed to form silicide. It should be understood that the diffusion regions implies the respective source regions and drain regions of the NMOS transistor portion and the PMOS transistor portion. This definition is similarly applied to the below-mentioned embodiment. As a consequence, stray resistance can be reduced. No further explanation is made of the subsequently performed aluminum wiring stages.

SECOND EMBODIMENT

In a semiconductor integrated circuit device according to the second embodiment of the present invention, both a gate electrode of an N-channel type MOS transistor and a gate electrode of a P-channel type MOS transistor are of N types. Accordingly, the N-channel type MOS transistor may become a surface channel type MOS transistor, whereas the P-channel type MOS transistor may become a buried channel type transistor.

A method for manufacturing a semiconductor integrated circuit device according to the second embodiment will now be explained with reference to the sectional views for illustrating manufacturing steps shown in FIGS. 3A to FIG. 3H.

It should be noted that the respective manufacturing steps for forming the $N^+$ type buried films 2 and the $P^+$ type buried films 3 in the P type silicon substrate 1, and thereafter for forming the element isolation oxide films 7 are the same as those of the conventional semiconductor integrated circuit device manufacturing method, as previously explained with reference to FIG. 1A.

Figure 3A:
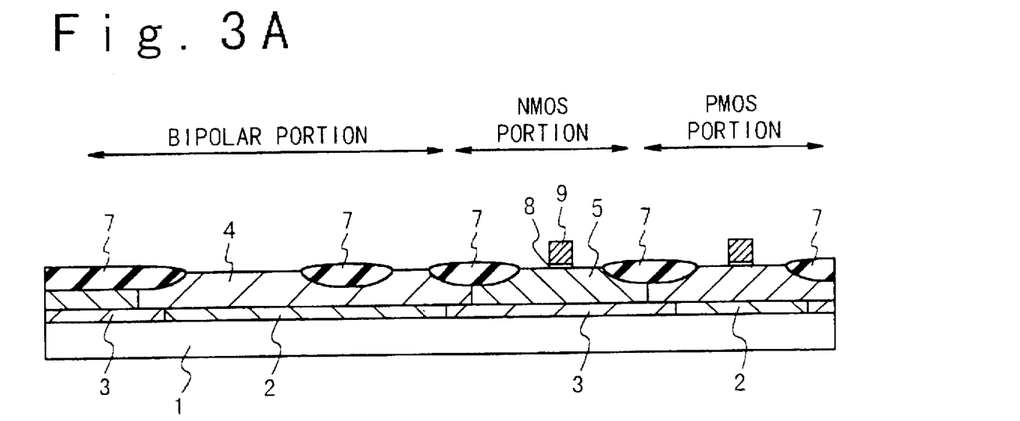
FIGS. 3A through 3H are cross sectional views for illustrating a manufacturing method of a semiconductor integrated circuit device according to a second embodiment of the present invention.

Upon completion of the formation of the element isolation oxide films 7, as shown in FIG. 3A, a gate oxide film 8 is formed on the entire surface, and an N type polysilicon 9 into which phosphorus ions are doped is furthermore deposited on this gate oxide film 8. It is assumed that the thickness of the gate oxide film 8 is selected in a range of 5 nm to 15 nm, and the thickness of the N type polysilicon 9 is selected in a range of 150 nm to 200 nm. The gate oxide film 8 and the N type polysilicon 9 provided in a region other than regions which will constitute a gate electrode of an NMOS transistor portion and a gate electrode of a PMOS transistor portion are etched back by performing a dry etching process so as to pattern the gate electrodes. It should be noted that the gate electrodes may be made from a deposited film of N type polysilicon and high melting-point metals such as tungsten. In this case, the thickness of the N type polysilicon 9 is selected from 100 nm to 150 nm, and the thickness of the high melting-point metal such as tungsten is selected in a range of 50 nm to 100 nm.

Figure 3B:
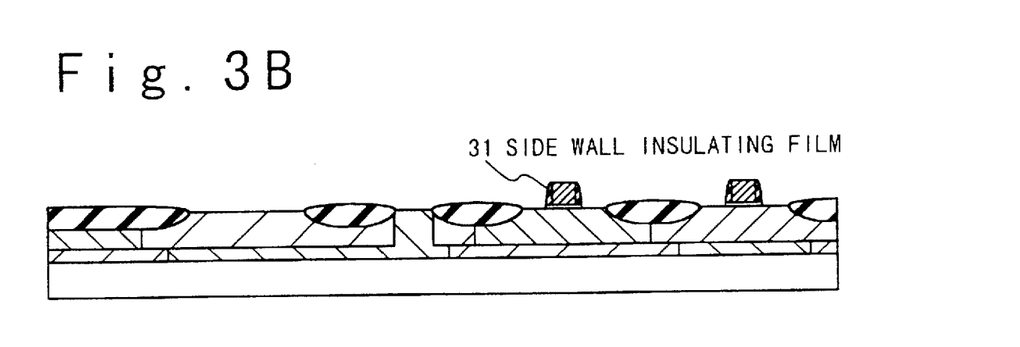
Figure 3C:
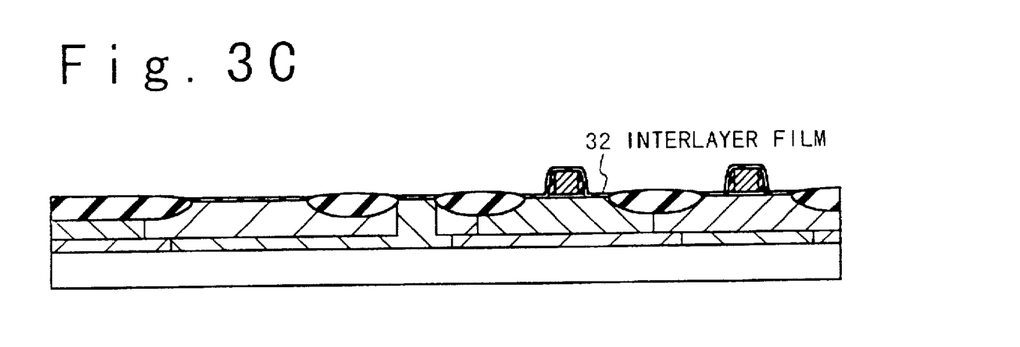

Next, an interlayer insulating film is formed. That is, as illustrated in FIG. 3B, side wall insulating films 31 are formed in such a manner that the thickness of the insulating film 31 is in a range of 40 nm to 60 nm. As will be discussed later, the side wall insulating films 31 may be manufactured after a bipolar transistor portion has been formed. Then, as indicated in FIG. 3C, an interlayer film 32 made of, for example, an oxide film is deposited as an intermediate insulating film on the entire surface in such a manner that the thickness of the interlayer film 32 is in a range of 20 nm to 60 nm.

Figure 3D:
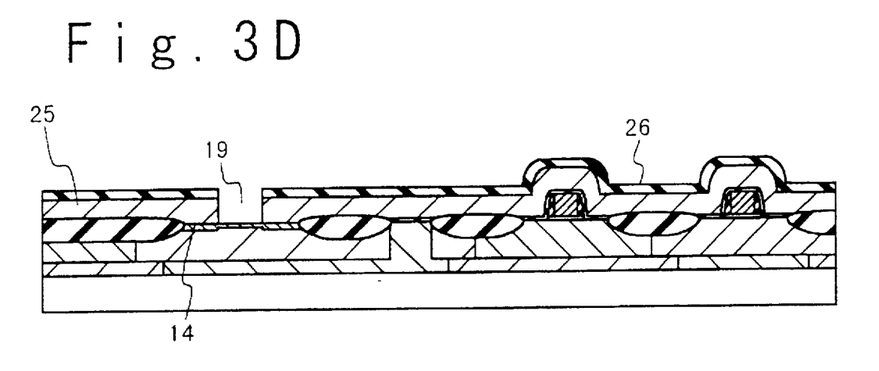
Figure 3E:
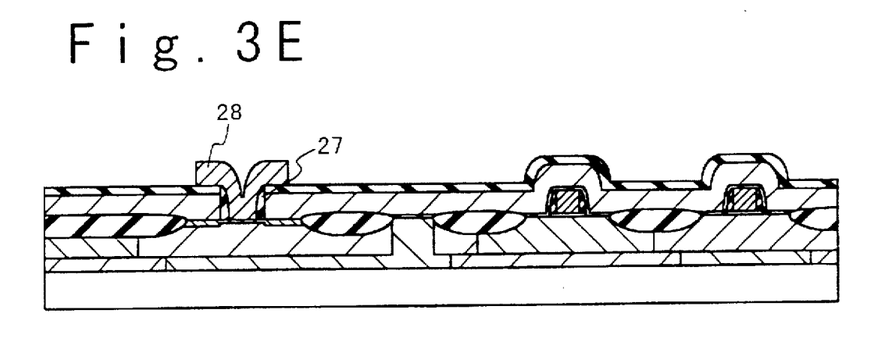

Thereafter, as shown in FIG. 3D, after the interlayer insulating film 32 of the bipolar transistor portion has been removed, a polysilicon film 25 which will constitute a base electrode of a bipolar transistor is deposited on the entire surface, and an insulating film 26 such as a nitride film is deposited on the deposited polysilicon film 25. Boron ions are previously injected into the polysilicon film 25. Then, an emitter contact hole 19 is formed in the polysilicon film 25 and the insulating film 26 as a contact region. Next, boron ions are implanted into a base region of the bipolar transistor portion as an impurity in order to form an intrinsic base layer by way of, for instance, ion implantation. It should be noted that the bipolar transistor according to the second embodiment corresponds to a two-layer polysilicon self-alignment type bipolar transistor similar to the first embodiment. Then, as shown in FIG. 3E, side wall insulating films 27 are formed within the emitter contact hole 19, and thereafter, a polysilicon film 28 which will constitute an emitter electrode is deposited on the entire surface. Either arsenic or phosphorus ions are previously added as an impurity into this polysilicon film 28. Subsequently, the polysilicon film 28 is etched back by way of a dry etching process to thereby pattern the emitter electrode.

Figure 3F:
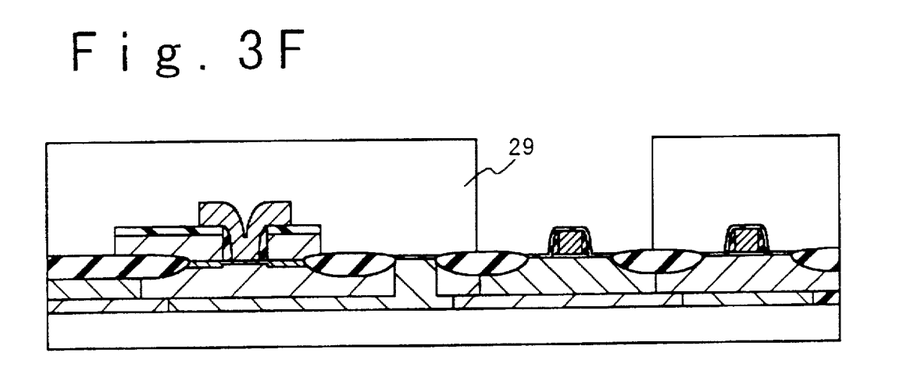

Thereafter, as indicated in FIG. 3F, both the insulating film 26 and the polysilicon film 25 are patterned. As a consequence, a part of the laminate film composed of the insulating film 26 and the polysilicon film 25 is removed in correspondence to the NMOS transistor portion and the CMOS circuit portion. Then, arsenic ions are implanted into a source region, drain region, and gate electrode of the NMOS transistor portion. The energy value of the ion implantation is set to 40 keV to 140 keV, depending upon the thickness of the interlayer film 32, in such a manner that arsenic ions may pass through the interlayer film 32 and may be injected into the silicon substrate 1 to a preselected depth. It should also be noted that the arsenic ions never penetrate through the polysilicon film of the gate electrode at this energy value.

Figure 3G:
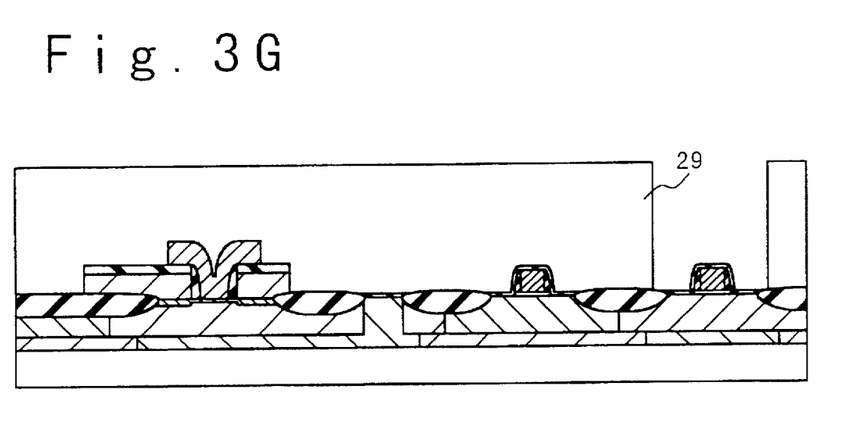

Next, as illustrated in FIG. 3G, $BF_2$ ions are implanted into a source region, drain region, and gate electrode of the PMOS transistor portion. The energy value of the ion implantation is set to an energy in a range of 40 keV to 90 keV, depending upon the thickness of the interlayer film 32, in such a manner that boron ions may pass through interlayer film 32 and may be injected into the silicon substrate 1 to a preselected depth.

Figure 3H:
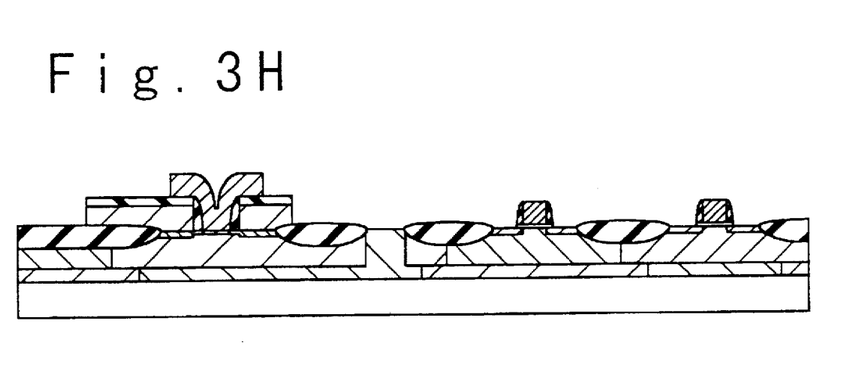

Next, as shown in FIG. 3H, the resultant semiconductor integrated circuit device is thermally processed in a temperature range from 850° C. to 900° C. for 10 minutes to 20 minutes. Accordingly, the impurity ions implanted into the source and drain regions of the NMOS transistor portion and PMOS transistor portion are activated, so that an N-channel type MOS transistor and a P-channel type MOS transistor may be manufactured. At the same time, the emitter forced diffusion of the bipolar transistor is carried out. Next, the diffusion layer and an upper portion of the gate electrode are exposed, which will be thereafter processed to form silicide. No further explanation is made of the subsequently performed aluminum wiring stages.

As previously explained in detail, in accordance with the method for manufacturing the semiconductor integrated circuit device of the present invention, the MOS transistor can be manufactured completely independent from the bipolar transistor. As a consequence, a BiCMOS device can be formed that contains CMOS transistors having gate electrodes whose length are of a very fine dimension, and a bipolar transistor with high performance on the same substrate. In this CMOS transistor, the so-called "short channel effect" can be suppressed irrespective of the channel types of MOS transistors.

What is claimed is:

1. A method of manufacturing a semiconductor integrated circuit device including a bipolar transistor and metal-oxide-semiconductor (MOS) transistors, comprising:

forming first and second gate electrode structures on first and second surface regions of a silicon substrate, respectively, wherein each of said first and second crate electrode structures has a polysilicon layer having no implanted impurity and formed on a gate oxide film;

forming a bipolar transistor portion including a base electrode and an emitter electrode in a third surface region on the silicon substrate;

implanting first impurity ions into said first surface region in self-alignment with said first gate electrode structure to form a source and drain of an N-channel MOS transistor; and implanting second impurity ions into said second surface region in self-alignment with said second gate electrode structure to form a source and drain of a P-channel MOS transistor after said forming of a bipolar transistor portion.

2. A method of manufacturing a semiconductor integrated circuit device according to claim 1, further comprising forming side wall insulating films on side walls of said first and second gate electrode structures before said implanting of first impurity ions and said implanting of second impurity ions.

3. A method of manufacturing a semiconductor integrated circuit device according to claim 1, further comprising forming silicide upper portions of said first and second gate electrode structures and of a first diffusion layer formed in said first surface region and a second diffusion layer formed in said second surface region.

4. A method of manufacturing a semiconductor integrated circuit device according to claim 1, wherein said bipolar transistor is a two-layer polysilicon self-alignment type bipolar transistor.

5. A method of manufacturing a semiconductor integrated circuit device according to claim 4, wherein said forming of a bipolar transistor portion including a base electrode and an emitter electrode includes:

forming an intrinsic base layer on said third surface region;

forming an emitter contact hole in a portion corresponding to said intrinsic base layer;

forming side wall insulating films on inner walls of said emitter contact hole; and depositing a polysilicon film in said emitter contact hole into which said side wall insulating films are formed to form an emitter electrode.

6. A method of manufacturing a semiconductor integrated circuit device according to claim 1, wherein said implanting of first impurity ions includes, after the first impurity ions are implanted in self-alignment with said first gate electrode structure, activating said first impurity ions contained in source and drain regions of said N-channel MOS transistor.

7. A method of manufacturing a semiconductor integrated circuit device including a bipolar transistor and metal-oxide-semiconductor (MOS) transistors, comprising:

forming first and second gate electrode structures on first and second surface regions of a silicon substrate, respectively, wherein each of said first and second gate electrode structures has a polysilicon layer having no implanted impurity and formed on a gate oxide film;

forming a bipolar transistor portion including a base electrode and an emitter electrode in a third surface region on the silicon substrate;

implanting first impurity ions into said first surface region in self-alignment with said first gate electrode structure to form a source and drain of an N-channel MOS transistor; and implanting second impurity ions into said second surface region in self-alignment with said second gate electrode structure to form a source and drain of a P-channel MOS transistor after said forming of a bipolar transistor portion; and wherein said implanting of second impurity ions includes: after said second impurity ions are implanted in self-alignment with said second gate electrode, performing heat treatment in a nitrogen atmosphere to provide an emitter forced diffusion; and after said performing of heat treatment, activating the second impurity ions contained in the source and drain regions by lamp annealing.

8. A method of manufacturing a semiconductor integrated circuit device including a bipolar transistor and metaloxide-semiconductor (MOS) transistors, comprising:

forming first and second gate electrode structures on first and second surface regions of a silicon substrate, respectively, wherein each of said first and second gate electrode structures has a polysilicon layer having no implanted impurity and formed on a gate oxide film;

forming a bipolar transistor portion including a base electrode and an emitter electrode in a third surface region on the silicon substrate;

implanting first impurity ions into said first surface region in a self-alignment with said first gate electrode structure to form a source and drain of an N-channel MOS transistor; and implanting second impurity ions into said second surface region in self-alignment with said second gate electrode structure to form a source and drain of a P-channel MOS transistor after said forming of a bipolar transistor portion; and forming an interlayer insulating film after forming said first and second gate electrode structures;

wherein said implanting of first impurity ions and said implanting of second impurity ions includes implanting said first and second impurity ions without removing said interlayer insulating film, respectively, and wherein said forming of a bipolar transistor portion including a base electrode and an emitter electrode includes implanting third impurity ions after said interlayer insulating film is removed.

9. A method of manufacturing a semiconductor integrated circuit device including a bipolar transistor and metal-oxide-semiconductor (MOS) transistors, comprising:

forming first and second gate electrode structures on first and second surface regions of a silicon substrate, respectively, wherein each of said first and second gate electrode structures has a polysilicon layer having no implanted impurity and formed on a gate oxide films;

forming a bipolar transistor portion including a base electrode and an emitter electrode in a third surface region on the silicon substrate;

implanting first impurity ions into said first surface region in self-alignment with said first gate electrode structure to form a source and drain of an N-channel MOS transistor; and implanting second impurity ions into said second surface region in self-alignment with said second gate electrode structure to form a source and drain of a P-channel MOS transistor after said forming of a bipolar transistor portion including a base electrode and an emitter electrode; and wherein said forming of a bipolar transistor portion including a base electrode and an emitter electrode is carried out after said first impurity ions are implanted, and before said second impurity ions are implanted.

10. A method of manufacturing a semiconductor integrated circuit device including a bipolar transistor and metal-oxide-semiconductor (MOS) transistors, comprising:

forming first and second gate electrode structures on first and second surface regions of a silicon substrate, respectively, wherein each of said first and second gate electrode structures has an N type polysilicon film on a gate oxide film;

implanting first impurity ions into said first surface region in self-alignment with said first gate electrode structure to form a source and drain of an N channel MOS transistor;

implanting second impurity ions into said second surface region in self-alignment with said second gate electrode structure to form a source and drain of a P channel MOS transistor; and forming a bipolar transistor portion including a base electrode and an emitter electrode in a third surface region on the silicon substrate before said implanting of first impurity ions and said implanting of second impurity ions.

11. A method of manufacturing a semiconductor integrated circuit device according to claim 10, further comprising forming side wall insulating films on side walls of said first and second gate electrode structures before said first impurity ions and said second impurity ions are implanted.

12. A method for manufacturing a semiconductor integrated circuit device according to claim 10, further comprising forming silicide films on upper portions of said first and second gate electrode structures and on said first diffusion layer formed in said first surface region and said second diffusion layer formed in said second surface region.

13. A method of manufacturing a semiconductor integrated circuit device according to claim 10, wherein said bipolar transistor is a two-layer polysilicon self-alignment type bipolar transistor.

14. A method of manufacturing a semiconductor integrated circuit device according to claim 13, wherein said forming of a bipolar transistor portion including a base electrode and an emitter electrode includes:

forming an intrinsic base layer on said third surface region;

forming an emitter contact hole in a portion corresponding to said intrinsic base layer;

forming side wall insulating films on inner walls of said emitter contact hole; and depositing a polysilicon film in the emitter contact hole into which said side wall insulating films are formed to form an emitter electrode.

15. A method of manufacturing a semiconductor integrated circuit device including a bipolar translator and metal-oxide-semiconductor (MOS) transistors, comprising:

forming first and second gate electrode structures on first and second surface regions of a silicon substrate, respectively, wherein each of said first and second gate electrode structures has an N type polysilicon film and a gate oxide film;

implanting first impurity ions into said first surface region in self-alignment with said first gate electrode structure to form a source and drain of an N channel MOS transistor;

implanting second impurity ions into said second surface region in self-alignment with said second gate electrode structure to form a source and drain of a P channel MOS transistor; and forming a bipolar transistor portion including a base electrode and an emitter electrode to form a bipolar transistor in a third surface region on the silicon substrate before said implanting of first impurity ions and said implanting of second impurity ions; and performing a heat treatment after said forming of said bipolar transistor portion including a base electrode and an emitter electrode, said implanting of first impurity ions, and said implanting of second impurity ions, and wherein said performing of a heat treatment includes:

activating said first and second impurity ions contained in source and drain regions of said N channel MOS transistor and said P channel MOS transistor; and carrying out an emitter forced diffusion to form said bipolar transistor.

16. A method of manufacturing a semiconductor integrated circuit device including a bipolar transistor and metal-oxide-semiconductor (MOS) transistors comprising:

implanting second impurity ions into said second surface region in self-alignment with said second gate electrode structure to form a source and drain of a P channel MOS transistor;

forming a bipolar transistor portion including a base electrode and an emitter electrode to form a bipolar transistor in a third surface region on the silicon substrate before said implanting of first impurity ions and said implanting of second impurity ions; and forming an interlayer insulating film after said first and second gate electrode structures are formed;

wherein said implanting of first impurity ions and said implanting of second impurity ions include implanting said first and second impurity ions without removing said interlayer insulating film, respectively, and wherein said forming of a bipolar transistor portion including a base electrode and an emitter electrode includes implanting third impurity ions after removing said interlayer insulating film.

17. A method of manufacturing a semiconductor integrated circuit device according to claim 7, further comprising forming said wall insulating films on said walls of said first and second gate electrode structures before said first impurity ions and said second impurity ions are implanted.

18. A method of manufacturing a semiconductor integrated circuit device according to claim 7, further comprising forming silicide upper portions of said first and second gate electrode structures and first diffusion layer formed in said first surface region and second diffusion layer formed in said second surface region.

19. A method of manufacturing a semiconductor integrated circuit device according to claim 7, wherein said bipolar transistor is a two-layer polysilicon self-alignment type bipolar transistor.

20. A method of manufacturing a semiconductor integrated circuit device according to claim 19, wherein said forming of a bipolar transistor portion including a base electrode and an emitter electrode includes:

forming an intrinsic base layer on said third surface region;

forming an emitter contact hole in a portion corresponding to said intrinsic base layer;

forming side wall insulating films on inner walls of said emitter contact hole; and depositing a polysilicon film in said emitter contact hole into which said side wall insulating films are formed to form an emitter electrode.

21. A method of manufacturing a semiconductor integrated circuit device according to claim 7, wherein said implanting of first impurity ions includes, after the first impurity ions are implanted in self-alignment with said first gate electrode structure, activating said first impurity ions contained in source and drain regions of said N-channel MOS transistor.

22. A method of manufacturing a semiconductor integrated circuit device according to claim 8, further comprising forming side wall insulating films on side walls of said first and second gate electrode structures before said first impurity ions and said second impurity ions are implanted.

23. A method of manufacturing a semiconductor integrated circuit device according to claim 8, further comprising forming silicide upper portions of said first and second gate electrode structures and of said first diffusion layer formed in said first surface region and said second diffusion layer formed in said second surface region.

24. A method of manufacturing a semiconductor integrated circuit device according to claim 8, wherein said bipolar transistor is a two-layer polysilicon self-alignment type bipolar transistor.

25. A method of manufacturing a semiconductor integrated circuit device according to claim 24, wherein said forming of a bipolar transistor portion including a base electrode and an emitter electrode includes:

forming an intrinsic base layer on said third surface region;

forming an emitter contact hole in a portion corresponding to said intrinsic base layer;

forming side wall insulating films on inner walls of said emitter contact hole; and depositing a polysilicon film in said emitter contact hole into which said side wall insulating films are formed to form an emitter electrode.

26. A method of manufacturing a semiconductor integrated circuit device according to claim 8, wherein said implanting of first impurity ions includes, after the first impurity ions are implanted in self-alignment with said first gate electrode structure, activating said first impurity ions contained in source and drain regions of said N-channel MOS transistor.

27. A method of manufacturing a semiconductor integrated circuit device according to claim 9, further comprising forming side wall insulating films on side walls of said first and second gate electrode structures before said first impurity ions and said second impurity ions are implanted.

28. A method of manufacturing a semiconductor integrated circuit device according to claim 9, further comprising forming silicide upper portions of said first and second gate electrode structures and of said first diffusion layer formed in said first surface region and said second diffusion layer formed in said second surface region.

29. A method of manufacturing a semiconductor integrated circuit device according to claim 9, wherein said bipolar transistor is a two-layer polysilicon self-alignment type bipolar transistor.

30. A method of manufacturing a semiconductor integrated circuit device according to claim 29, wherein said forming of a bipolar transistor portion including a base electrode and an emitter electrode includes:

forming an intrinsic base layer on said third surface region;

forming an emitter contact hole in a portion corresponding to said intrinsic base layer;

forming side wall insulating films on inner walls of said emitter contact hole; and depositing a polysilicon film in said emitter contact hole into which said side wall insulating films are formed to form an emitter electrode.

31. A method of manufacturing a semiconductor integrated circuit device according to claim 9, wherein said implanting of first impurity ions includes, after the first impurity ions are implanted in self-alignment with said first gate electrode structure, activating said first impurity ions contained in source and drain regions of said N-channel MOS transistor.

32. A method of manufacturing a semiconductor integrated circuit device according to claim 15, further comprising forming side wall insulating films on side walls of said first and second gate electrode structures before said first impurity ions and said second impurity ions are implanted.

33. A method of manufacturing a semiconductor integrated circuit device according to claim 15, further comprising forming silicide films on upper portions of said first and second gate electrode structures and of said first diffusion layer formed in said first surface region and said second diffusion layer formed in said second surface region.

34. A method of manufacturing a semiconductor integrated circuit device according to claim 15, where said bipolar transistor is a two-layer polysilicon self-alignment type bipolar transistor.

35. A method of manufacturing a semiconductor integrated circuit device according to claim 34, wherein said forming of a bipolar transistor portion including a base electrode and an emitter electrode includes:

forming an intrinsic base layer on said third surface region;

forming an emitter contact hole in a portion corresponding to said intrinsic base layer;

forming side wall insulating films on inner walls of said emitter contact hole; and depositing a polysilicon film in the emitter contact hole into which said side wall insulating film: are formed to form an emitter electrode.

36. A method for manufacturing a semiconductor integrated circuit device according to claim 16, further comprising forming side wall insulating films on side walls of said first and second gate electrode structures before said first impurity ions and said second impurity ions are implanted.

37. A method for manufacturing a semiconductor integrated circuit device according to claim 16, further comprising forming silicide upper portions of said first and second gate electrode structures and of said first diffusion layer formed in said first surface region and said second diffusion layer formed in said second surface region.

38. A method for manufacturing a semiconductor integrated circuit device according to claim 16, wherein said bipolar transistor is a two-layer polysilicon self-alignment type bipolar transistor.

39. A method of manufacturing a semiconductor integrated circuit device according to claim 38, wherein said forming of a bipolar transistor portion including a base electrode and an emitter electrode includes:

forming an intrinsic base layer on said third surface region;

forming an emitter contact hole in a portion corresponding to said intrinsic base layer;

forming side wall insulating films on inner walls of said emitter contact hole; and depositing a polysilicon film in said emitter contact hole into which said side wall insulating films are formed to form an emitter electrode.

* * * * *